United States Patent
Ho et al.

(10) Patent No.: US 7,017,070 B1
(45) Date of Patent: Mar. 21, 2006

(54) APPARATUS FOR SYNCHRONIZATION OF DOUBLE DATA RATE SIGNALING

(75) Inventors: Chak Cheung Edward Ho, Markham (CA); Oleg Drapkin, Richmond Hill (CA); Carl Mizuyabu, Thornhill (CA); Ray Chau, Toronto (CA); Gordon Caruk, Bramalea (CA)

(73) Assignee: ATI International SRL, Christchurch (BB)

( * ) Notice: Subject to any disclaimer, the term of this patent is extended or adjusted under 35 U.S.C. 154(b) by 564 days.

(21) Appl. No.: 09/687,858

(22) Filed: Oct. 13, 2000

(51) Int. Cl.
*G06F 1/12* (2006.01)
*G06F 1/04* (2006.01)

(52) U.S. Cl. ...................................... 713/503; 713/401
(58) Field of Classification Search ................ 713/400, 713/401, 503
See application file for complete search history.

(56) References Cited

U.S. PATENT DOCUMENTS

| | | | | |
|---|---|---|---|---|
| 4,497,056 A | * | 1/1985 | Sugamori | 714/736 |
| 5,878,055 A | * | 3/1999 | Allen | 714/744 |
| 6,067,272 A | * | 5/2000 | Foss et al. | 365/233 |
| 6,198,326 B1 | * | 3/2001 | Choi et al. | 327/263 |
| 6,397,312 B1 | * | 5/2002 | Nakano et al. | 711/167 |
| 6,430,697 B1 | * | 8/2002 | Muljono | 713/600 |

FOREIGN PATENT DOCUMENTS

JP      11205102 A    *   7/1999

* cited by examiner

*Primary Examiner*—Lynne H. Browne
*Assistant Examiner*—Eric Chang
(74) *Attorney, Agent, or Firm*—Vedder, Price, Kaufman & Kammholz, P.C.

(57) ABSTRACT

A signal phase shifting circuit shifts the phase of an input signal, such as a STROBE signal, based on a reference signal, such as a CLOCK signal, to facilitate, for example, receiving of double data rate data. The signal phase shifting circuit includes a reference signal period dividing circuit having a feedback delay matching array operatively coupled to one of a plurality of voltage control delay lines. This signal phase shifting circuit also includes a variable delay circuit that provides a phase shifted output signal, such as a phase shifted STROBE signal, that includes a delay stage in a phase shifted output signal drive buffer coupled to the delay stage, such as a voltage control delay line. The feedback delay matching array includes a plurality of serially coupled buffer stages operatively coupled to compensate for delay variations associated with the phase shifted output signal drive buffer in the variable delay circuit.

6 Claims, 3 Drawing Sheets

APPARATUS FOR SYNCHRONIZATION OF DOUBLE DATA RATE SIGNALING

FIELD OF THE INVENTION

The invention relates generally to synchronization circuits and methods and more particularly to synchronization circuits and methods used with double data rate transfer schemes.

BACKGROUND OF THE INVENTION

Memory chips are known that employ a double data rate (DDR) communication scheme. Such a memory may be used in any suitable apparatus including, for example, a graphics acceleration system employing one or more graphics chips that send information to and retrieve data from a memory, such as a frame buffer. Memory interface circuits for facilitating a double data rate communication scheme are also known.

With double data rate communication schemes, a DATA signal, STROBE signal and CLOCK signal are used to communicate data to and from a memory such as between a memory and another circuit such as a graphics accelerator, CPU or any other suitable circuit. With double data rate schemes, typically, the memory chip, such as a DDR SDRAM (double data rate synchronous DRAM) typically expects a DATA signal to be sent to the memory chip, from a graphics chip for example, together with a special STROBE signal. Typically, the STROBE signal has the same frequency as the CLOCK signal that is generated by, for example, the graphics chip, or other suitable circuit. The DATA signal is synchronized with the CLOCK signal. The STROBE signal is typically sent so that the strobe pulse occurs in the middle of a DATA signal window. This occurs typically when the graphics chip is sending data to the memory. Accordingly, the STROBE signal is typically sent later by a quarter of the clock period compared to the DATA signal. This offset allows input memory flip flops to receive the data.

In receiving mode, when the graphics chip or other circuit is receiving data from memory, the memory chip generates and sends the STROBE and DATA signals back. However, typical double data rate interface requirements require the memory chip to send the STROBE and DATA signals simultaneously to simplify the on board memory chip circuitry. Accordingly, a receiving circuit, such as a graphics chip or other suitable circuit, has to delay internally, the received STROBE signal that was sent from the memory chip to provide the same conditions for the receiving circuit input flip flop as for the sending circuits. In other words, the received STROBE signal that is actually the clock input of the graphics chip flip flop has to be in the middle of the data signal window. This time offset has to be stable, including over temperature changes, voltage changes and fabrication process variations.

One approach to providing a requisite delay in the receiving circuit includes a delay circuit that uses several inverters to delay the STROBE signal. The time delay can be adjusted to be a quarter of the clock period (according to typical DDR interface requirements, the data signal has to be received at the rising and falling edge of the STROBE signal). However, in the case where the time delay is temperature, voltage or process dependent, a variable delay in the offset STROBE signal can occur. This can result in loss of data.

For example, FIG. 1 is a diagrammatic illustration of one example of a signal phase shifting circuit 10 that suitably phase shifts a received input signal 12, such as a received STROBE signal, back, for example, a quarter of a CLOCK period so that received data 14 is suitably latched by a latch circuit 16 before the data is passed to core logic 18. A reference signal 20, such as the CLOCK signal, is received by a reference signal period dividing circuit 22. The reference signal period dividing circuit 22 provides a delay control signal 26 that is a voltage controlled delay control signal, to a variable delay circuit 28.

The reference signal period dividing circuit 22 is configured as a type of DLL (delay lock loop). The DLL consists of a phase frequency detector 30, a low pass filter 32, a charge pump 34 and a voltage controlled delay line 37 having several serially connected voltage controlled buffers 36a–36n. With this configuration the propagation time delay between the input of the voltage control delay line 37 and the output of the voltage control delay line 37 is equal to the clock period. The DLL 22 operates, as known in the art, with internal negative feedback. If the reference clock period is not changing, then the DLL will provide synchronization within a reasonable temperature, voltage and fabrication process variation. The phase detector 30 will change the delay control voltage 26 of the voltage control delay line 37 to provide a change any time the clock period time delay between the input of the VCDL 37 and its output is more than one clock period. The delay control voltage will be different with different temperatures, supply voltages or fabrication process variation.

The input signal 12, in this example the STROBE signal, is received by receiver buffer 38 and passed to the variable delay circuit 28 which also employs another voltage control delay line 40 that is commonly controlled by the same delay control signal 26. Since printed circuit board layouts and on chip layouts can add additional delays, the multiplexer 42 and phase shifted output signal drive buffer 44 are used as a delay stage to vary a delay setting of the variable delay circuit 28 to allow selection of delay to compensate for additional printed circuit board layout delays, if desired. A control register 46 is used to control select lines 48 to select the amount of delay required to provide a quarter clock delay or phase shift between the input signal 12 and the shifted signal 50. This allows a type of step control to accurately obtain the requisite STROBE signal in the receiving circuit once the circuit board has been laid out.

As shown, the signal phase shifting circuit 10 can be considered to have a delay lock loop with two voltage control delay lines 40 and 37. Both of them are controlled by the same delay control voltage 26 and they are made of the same delay elements except the voltage control delay line 37 has four times the number of delay elements as the delay line 40. The shorter delay line is used to delay the STROBE signal by a quarter of the memory clock period. Accordingly, since the STROBE signal has the same frequency as the memory clock, and since each STROBE signal represents one valid data cycle, the "quarter delay" will place the STROBE signal in the middle of the data window.

A problem arises since the multiplexer 42 and buffer 44 can shift over temperature and at high frequencies, thereby destabilizing the signal phase shifting required for the STROBE signal.

Another approach may be to have a separate strobe line for every data pad to duplicate the delay chain for every data line. However, a problem can arise due to the phase shift in the STROBE signal and would drastically increase the complexity in fabrication costs of the device. It is desirable to have a constant offset regardless of the supply voltage variations, temperature variations and fabrication process variations.

Accordingly, a need exists for an improved apparatus to facilitate double data rate signaling.

BRIEF DESCRIPTION OF THE DRAWINGS

The invention will be more readily understood with reference to the following drawings wherein.

DETAILED DESCRIPTION OF A PREFERRED EMBODIMENT OF THE INVENTION

A signal phase shifting circuit shifts the phase of an input signal, such as a STROBE signal, based on a reference signal, such as a CLOCK signal, to facilitate, for example, receiving of double data rate data. The signal phase shifting circuit includes a reference signal period dividing circuit having a feedback delay matching array operatively coupled to one of a plurality of voltage control delay lines (VCDL). The signal phase shifting circuit also includes a variable delay circuit that provides a phase shifted output signal, such as a phase shifted STROBE signal, that includes a delay stage and a phase shifted output signal drive buffer coupled to the delay stage, such as a voltage control delay line. The feedback delay matching array includes a plurality of serially coupled buffer stages operatively coupled to compensate for delay variations associated with the phase shifted output signal drive buffer in the variable delay circuit. Accordingly, a more stable STROBE signal phase shift occurs that is less sensitive to temperature and voltage variations while still allowing the compensation of delay due to, for example, printed circuit board layout delays and other delays.

Figure 1:
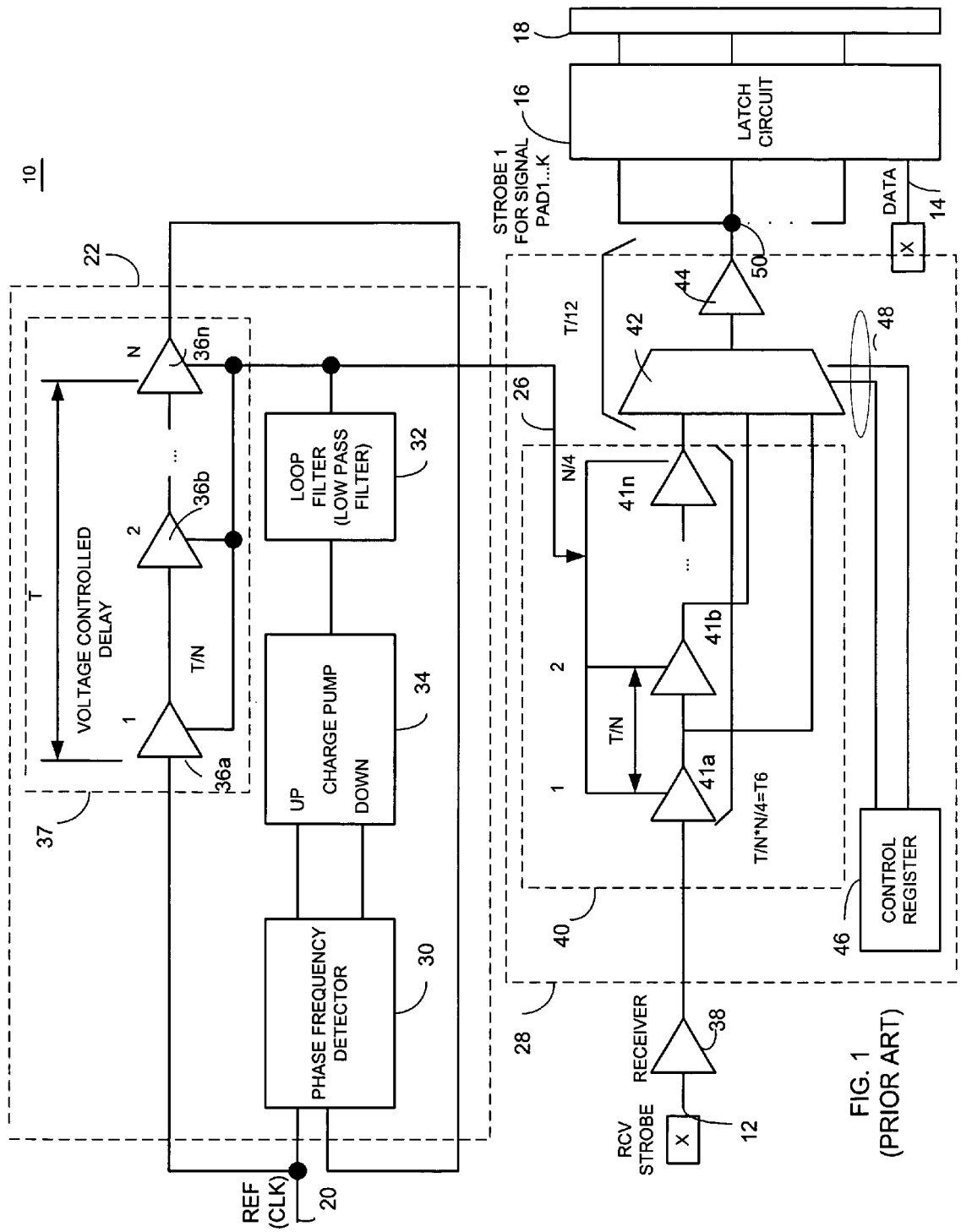
FIG. 1 is a block diagram illustrating a known signal phase shifting circuit used in a double data rate receiving interface circuit.
Figure 2:
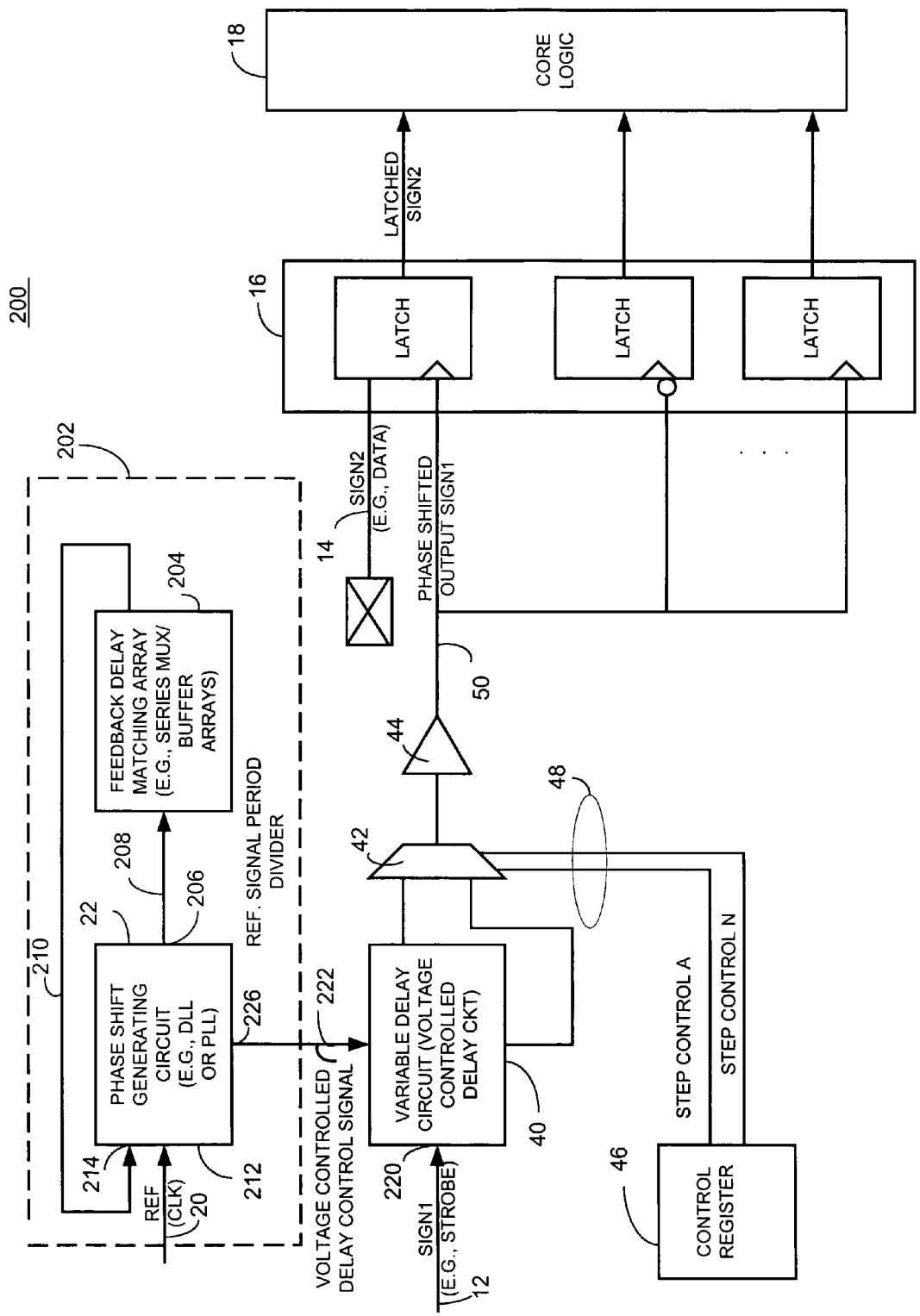
FIG. 2 is a block diagram illustrating one example of a signal phase shifting circuit in accordance with one embodiment of the invention.

FIG. 2 illustrates a signal phase shifting circuit 200 that includes a reference signal period dividing circuit 202 that includes the phase shift generating circuit 22 and a feedback delay matching array 204 that is operatively coupled to an output 206 of the phase shift generating circuit 22. The feedback delay matching array 204 receives a phase shifted reference signal 208 produced by the phase shift generating circuit 22. The feedback delay matching array 204 produces a feedback control signal 210 that is fed back to the phase shift generating circuit 22. The feedback control signal 210 is delayed by the delay matching array 204.

The reference signal period dividing circuit 202 includes a first input 212 that receives the reference signal 20, such as a CLOCK signal, a second input 214 that receives the feedback control signal 210. The phase shift generating circuit 22 is operatively responsive to the reference signal 20 and to the feedback control signal 210 to phase shift the reference signal 20 to produce the phase shifted reference signal 208.

The signal phase shifting circuit 200 also includes the variable delay circuit 40 that includes an input 220 that receives the input signal 12, such as the STROBE signal. The variable delay circuit 40 is also operatively responsive to the delay control signal 222 produced by the phase shift generating circuit 22 to vary the delay provided by the variable delay circuit 40.

The feedback delay matching array 204 compensates for delay variations associated with the phase shifted output signal drive buffer 44 and multiplexer 42. In addition, the feedback delay matching array 204 matches the delay associated with the signal drive buffer 44 and the multiplexer 42.

The reference signal period dividing circuit 202 also includes an output 226 that provides the delay control signal 222 for the variable delay circuit 40. The variable delay circuit 40 provides the phase shifted output signal 50 (STROBE signal) through the multiplexer 42 and buffer 44.

Figure 3:
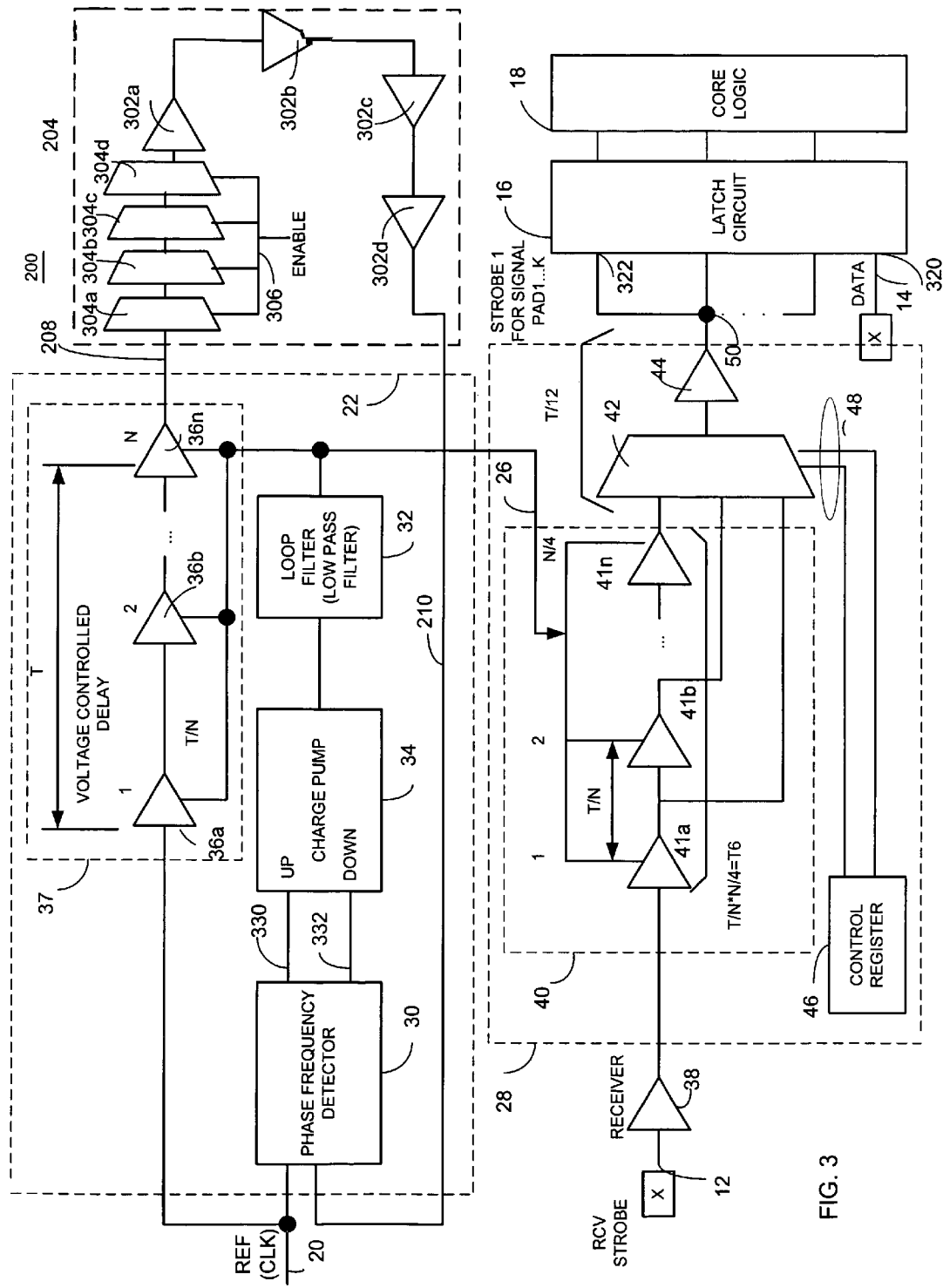
FIG. 3 is a block diagram illustrating one example of a signal phase shifting circuit in accordance with one embodiment of the invention.

Referring to FIG. 3, in one embodiment, the feedback delay matching array 204 includes a plurality of serially coupled buffer stages 302a, 302b, 302c and 302d that are operatively coupled to compensate for delay variations associated with the phase shifted output signal buffer 44 and the multiplexer 42. In this example, there are four buffer stages as well as four multiplexer stages. Also in this embodiment the feedback delay matching array 204 includes a plurality of serially coupled multiplexers 304a–304d. The multiplexer and buffer stages 302 and 304 are operatively coupled to compensate for delay variations associated with the multiplexer 42 and the phase shifted output signal drive buffer 44 in the variable delay circuit. This circuit shifts a received STROBE signal by a quarter of the CLOCK period. Voltage controlled delay 37 together with the feedback delay matching array 204 have a total delay that equals the CLOCK period. By using only a quarter of the voltage controlled buffers 36a–36n, as well as a quarter of the serially coupled buffer stages 302a–302d, and a quarter of serially coupled multiplexers 304a–304d, the STROBE signal can be shifted by precisely a quarter of the CLOCK period. If a half of the CLOCK period shift is needed for the STROBE signal, the circuit should provide serial connection with the voltage controlled delay using only two multiplexers and two buffer stages, and after that only a half of them are used to shift the STROBE signal.

As shown, the multiplexer 42 and drive buffer 44 are shown functionally since a plurality may be used, if desired. It will be recognized that any suitable number of multiplexer and buffer stages may be used depending upon for example PCB layout delays. The multiplexers 304a–304d are suitably enabled through enable lines 306 under control of a suitable control register and any other suitable mechanism.

The variable delay circuit 28 also includes the multiplexer 42 and output signal drive buffer 44, as well as the delay stage buffers 41a–41n. The multiplexer 42 is operatively coupled to vary the delay setting of a variable delay stage 40 by selectively switching between different numbers of delay buffers 41a–41n. This is done by controlling the select lines 48 through control register 46 or through any other suitable mechanism.

The latch circuit 16 serves as a data latch having an input 320 that is operatively coupled to receive the data 14, and a second input 322 operatively coupled to receive the phase shifted output signal 50 so received data is appropriately latched with respect to the phase adjusted STROBE signal. As noted above, the STROBE signal is associated with a double data rate communication. For example, it may be generated by a double data rate memory device.

The phase shift generating circuit 22 that includes the serially coupled buffers 36a–36n has output 208 of the control delay stage passed to the feedback delay matching array 204 which attempts to match the delay presented by circuits 42 and 44.

The phase shift generating circuit 22 includes the phase frequency detector circuit 30 that compares the reference signal 20 with the feedback control signal 210. The charge pump 34 is operatively coupled to the phase frequency detector 30 to receive an up count 330 or down count 332 for the charge pump circuit 34 depending upon the amount of difference in phases. The loop filter (low pass filter 32) receives the output 334 from the charge pump circuit 34 and provides delay control signal 26 for the variable delay circuit 40 and for the circuit 37.

The above-described phase shifting circuit provides a feedback delay matching array that is operatively coupled to one of a plurality of voltage control delay lines to compensate for delay variations associated with phase shifted output signal driver and/or any associated multiplexers or circuits associated with the phase shifted output signal driver buffer. Accordingly, a more stable STROBE phase shifting circuit is provided for a receiver used for double data rate communications.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A signal phase shifting circuit operative to shift the phase of a STROBE signal based on a clock signal comprising:
   a clock signal period dividing circuit having:
      a first input that receives the clock signal,
      a second input that receives a feedback control signal,
      a phase shift generating circuit operatively responsive to the clock signal and the feedback control signal;
      an output that provides a voltage controlled delay control signal for a variable delay circuit, and
      a feedback delay matching array operatively coupled to an output of the phase shift generating circuit, that produces the feedback control signal; and
   the variable delay circuit including an input that receives the STROBE signal and being operatively responsive to the delay control signal, to provide a phase shifted output signal of the STROBE signal associated with a double data rate communication; and
   wherein the phase shift generating circuit includes a delay lock loop circuit operatively responsive to the clock signal and the feedback control signal and wherein the feedback delay matching array includes buffer stages that compensate for delay variations associated with a phase shifted output signal drive buffer and multiplexing circuit in a STROBE signal receive path.

2. The signal phase shifting circuit of claim 1 wherein the variable delay circuit includes a delay stage and at least one phase shifted output signal driver buffer operatively coupled to the delay stage.

3. The signal phase shifting circuit of claim 2 wherein the feedback delay matching array includes a plurality of serially coupled buffer stages operatively coupled to compensate for delay variations associated with the at least one phase shifted output signal drive buffer.

4. The signal phase shifting circuit of claim 1 wherein the variable delay circuit includes a delay stage and at least one multiplexer operatively coupled to vary a delay setting of the variable delay stage, and at least one phase shifted output signal drive buffer operatively coupled to an output of the at least one multiplexer.

5. The signal phase shifting circuit of claim 4 wherein the feedback delay matching array includes a plurality of serially coupled multiplexer and buffer stages operatively coupled to compensate for delay variations associated with the at least one multiplexer and the at least one phase shifted output signal drive buffer in the variable delay circuit.

6. The signal phase shifting circuit of claim 1 wherein the phase shift generating circuit includes a plurality of serially coupled buffers that form a controlled delay stage and wherein the feedback delay matching array includes a plurality of serially coupled multiplexer and buffer stages operatively coupled to the plurality of serially coupled buffers.

* * * * *